(12) United States Patent
Yang et al.

(10) Patent No.: US 10,172,266 B2
(45) Date of Patent: Jan. 1, 2019

(54) SHIELDING COVER MOUNTING AND DISMOUNTING APPARATUS

(71) Applicant: PEGATRON CORPORATION, Taipei (TW)

(72) Inventors: Chun-Hou Yang, Taipei (TW); Chih-Ming Hsu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 317 days.

(21) Appl. No.: 15/296,052

(22) Filed: Oct. 18, 2016

(65) Prior Publication Data
US 2017/0135254 A1    May 11, 2017

(30) Foreign Application Priority Data
Nov. 5, 2015 (TW) .............................. 104217694 U (51) Int. Cl.
*H05K 13/00* (2006.01)
*B23K 1/018* (2006.01)
(Continued)

(52) U.S. Cl.
CPC ......... *H05K 13/0069* (2013.01); *B23K 1/018* (2013.01); *H05K 3/3494* (2013.01);
(Continued)

(58) Field of Classification Search
CPC .......... H05K 3/225; H05K 3/34; H05K 3/341; H05K 3/3415; H05K 3/3494; H05K 13/0069; H05K 13/0408; H05K 13/046; H05K 13/0465; H05K 13/0486; H05K 13/0817; Y10T 29/49144; Y10T 29/53174; Y10T 29/53274; Y10T 29/53283; B23K 1/018; B23K 3/087; B23K 2101/42
See application file for complete search history.

(56) References Cited

U.S. PATENT DOCUMENTS 5,402,563 A * 4/1995 Satoh ................. H05K 13/0486
                                                    228/264
5,740,954 A * 4/1998 Pai ......................... B23K 1/018
                                                    228/40

(Continued)

FOREIGN PATENT DOCUMENTS

TW          I296234         5/2008

*Primary Examiner* — Peter DungBa Vo
*Assistant Examiner* — Joshua D Anderson
(74) *Attorney, Agent, or Firm* — Winston Hsu (57) ABSTRACT

A shielding cover mounting and dismounting apparatus for mounting or dismounting a shielding cover connected with a circuit board. The circuit board has an upper surface and a lower surface, and the shielding cover is connected with the lower surface. The apparatus includes a base, a first supporting seat, a second supporting seat, a heater and a moving seat. The first supporting seat is disposed on the base and has a bearing cavity. The shielding cover and the circuit board are disposed in the bearing cavity, and the shielding cover is disposed between the circuit board and a bottom surface of the bearing cavity. The second supporting seat is disposed in an opening of the bearing cavity. The heater is disposed at one side of the upper surface of the circuit board. The moving seat drives the heater to move closer to or away from the circuit board.

10 Claims, 9 Drawing Sheets

(51) Int. Cl.
*H05K 3/34* (2006.01)
*H05K 13/04* (2006.01)
*H05K 3/22* (2006.01)
*B23K 101/42* (2006.01)

(52) U.S. Cl.
CPC ..... *H05K 13/0465* (2013.01); *H05K 13/0486* (2013.01); *B23K 2101/42* (2018.08); *H05K 3/225* (2013.01); *Y10T 29/53174* (2015.01); *Y10T 29/53274* (2015.01)

(56) References Cited

U.S. PATENT DOCUMENTS

| | | |
|---|---|---|
| 8,434,670 B2 | 5/2013 | Okada |
| 2012/0018084 A1* | 1/2012 | Jang ............ H05K 3/305 156/230 |
| 2012/0090195 A1* | 4/2012 | Takeuchi ........ H05K 3/225 34/487 |

* cited by examiner

SHIELDING COVER MOUNTING AND DISMOUNTING APPARATUS

CROSS REFERENCE TO RELATED APPLICATION

This non-provisional application claims priority to Taiwan Application Serial Number 104217694, filed Nov. 5, 2015, which is herein incorporated by reference.

BACKGROUND OF THE INVENTION

1. Field of the Invention

The invention of this disclosure relates to a manufacture apparatus and, in particular, to a mounting and dismounting apparatus for dismounting a shielding cover from and soldering a shielding cover on a circuit board.

2. Description of the Prior Art

For electromagnetic shielding purpose, some electronic components on a circuit board are required to add a shielding cover made of material such as aluminum. Currently the rework of the shielding cover is performed by manual operations. That is, when removing a shielding cover from a circuit board, it is required to manually remove the shielding cover by melting the solder using a heat gun based on the contour of the shielding cover. After the maintenance is accomplished, the shielding cover is soldered back to the circuit board by way of manual soldering.

However, for the increasingly miniaturized electronic devices (such as mobile phones), the electronic components (including the shielding cover) on the circuit board also become smaller. Therefore, it becomes more and more difficult to remove the shielding cover during rework. Except for the difficulty of removing the shielding cover manually and the damage to the integrated circuit chips underneath during the heating process, the circuit board after the shielding cover being removed needs another solder-removing process to solder back the shielding cover again. Such process is time-consuming, and the quality and stability of the rework cannot be guaranteed.

SUMMARY OF THE INVENTION

The invention of the present disclosure is directed to a shielding cover mounting and dismounting apparatus to increase the efficiency and stability of the rework of the shielding cover.

In one embodiment of the present disclosure, a shielding cover mounting and dismounting apparatus is provided to mount or dismount a shielding cover connected with a circuit board. The circuit board has an upper surface and a lower surface, and the shielding cover is connected with the lower surface. The shielding cover mounting and dismounting apparatus includes a base, a first supporting seat, a second supporting seat, a heater and a moving seat. The first supporting seat is disposed on the base and has a bearing cavity. The shielding cover and the circuit board are disposed in the bearing cavity, and the shielding cover is disposed between the circuit board and a bottom surface of the bearing cavity. The second supporting seat includes a second elastic member. The second supporting seat is disposed in an opening of the bearing cavity, and the second elastic member supports the second supporting seat on the base, whereby the second supporting seat can move relative to the first supporting seat in the opening via the second elastic member, wherein the position of the second supporting seat corresponds to the shielding cover. The heater is disposed at one side of the upper surface of the circuit board, and is movably abutted on the upper surface of the circuit board to heat the shielding cover, whereby the shielding cover is capable of being dismounted from the circuit board. The moving seat includes a plurality of third elastic members. The third elastic members connect the moving seat to the heater, and the moving seat drives the heater to move closer to or away from the circuit board.

In an embodiment of the shielding cover mounting and dismounting apparatus of the present disclosure, the third elastic members are disposed at a first side of the heater. The moving seat further has a stop member, and the stop member is disposed outside a second side of the heater. When the heater abuts on the upper surface of the circuit board, the third elastic members pushes the heater, and the second side of the heater abuts on the stop member. The second side of the heater is hung from the moving seat.

In an embodiment of the shielding cover mounting and dismounting apparatus of the present disclosure, the base further includes a plurality of first elastic members. When the moving seat drives the heater to move closer to the circuit board to abut on the upper surface of the circuit board, the first supporting seat exerts force on the base whereby the first elastic members are compressed.

In an embodiment of the shielding cover mounting and dismounting apparatus of the present disclosure, when the moving seat drives the heater to move closer to the circuit board to abut on the upper surface of the circuit board, the shielding cover exerts force to the second supporting seat. The second supporting seat exerts force on the second elastic member, whereby the second elastic member is compressed.

In an embodiment of the shielding cover mounting and dismounting apparatus of the present disclosure, the circuit board further includes an upper shielding cover. The upper shielding cover is connected with the upper surface of the circuit board, and the heater abuts on the upper shielding cover to heat the upper shielding cover.

In an embodiment of the shielding cover mounting and dismounting apparatus of the present disclosure, the heater further includes a fourth elastic member. The fourth elastic member is protrudingly disposed at one side of the heater opposite to the connection of the moving seat. When the heater abuts on the upper shielding cover of the circuit board, the upper shielding cover compresses the fourth elastic member; when the heater moves away from the upper shielding cover, the fourth elastic member pushes the upper shielding cover to separate the heater from the upper shielding cover.

In an embodiment of the shielding cover mounting and dismounting apparatus of the present disclosure, the heater further has a heating portion. A first peripheral contour of the heating portion corresponds to a second peripheral contour of the upper shielding cover. When the heater abuts on the upper shielding cover, the first peripheral contour of the heating portion touches the second peripheral contour of the upper shielding cover to heat the second peripheral contour of the upper shielding cover.

In an embodiment of the shielding cover mounting and dismounting apparatus of the present disclosure, the heater further has a heating portion. The heating portion is disposed at one side of the upper surface corresponding to the position of the shielding cover. A first peripheral contour of the heating portion corresponds to a third peripheral contour of the shielding cover. When the heater abuts on the upper surface, the heating portion heats the third peripheral contour of the shielding cover.

In an embodiment of the shielding cover mounting and dismounting apparatus of the present disclosure, the shielding cover is connected with the lower surface by solder.

The shielding cover mounting and dismounting apparatus of the present disclosure is capable of soldering the shielding cover back to the circuit board without removing the residual solder. The speed of mounting and dismounting the shielding cover can be accelerated, and the quality and stability of the mounting and dismounting process can be guaranteed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
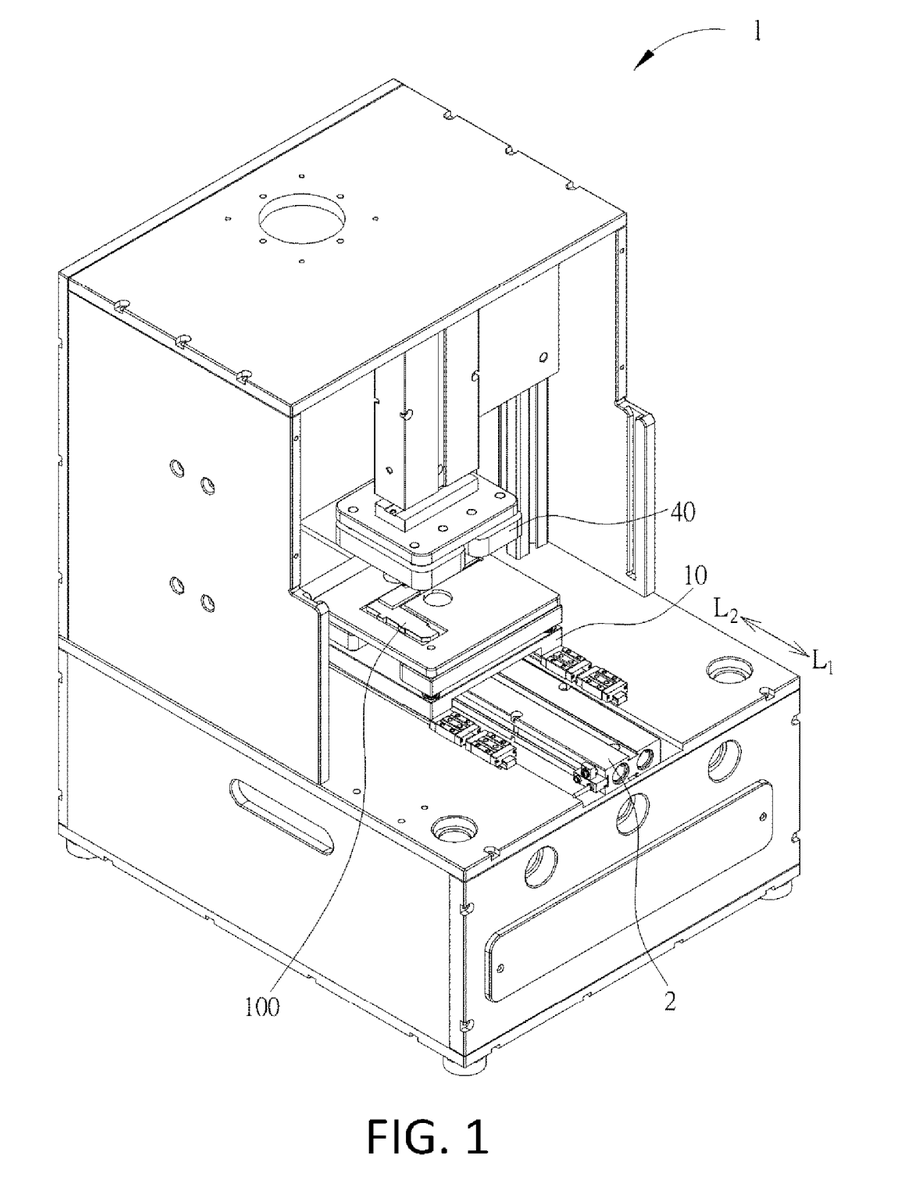
FIG. 1 is a schematic diagram of the shielding cover mounting and dismounting apparatus according to an embodiment of the present disclosure.

Please refer to FIG. 1, which is a schematic diagram of the shielding cover mounting and dismounting apparatus according to an embodiment of the present disclosure. For illustration purpose, some components of the shielding cover mounting and dismounting apparatus 1 are omitted. The shielding cover mounting and dismounting apparatus 1 can dismount the shielding cover connected with the circuit board 100, and re-solder the dismounted shielding cover back to the circuit board 100. The apparatus moves a base 10 and a supporting seat and the circuit board thereon along a direction $L_2$ using a rail 2 to a position below a heater 40 to dismount or solder the shielding cover, and moves out the base 10 and the supporting seat and the circuit board thereon along the direction $L_1$ for heat dissipation and subsequent maintenance after processing. (The heat dissipation device on the shielding cover mounting and dismounting apparatus 1 is not shown in the drawing, but can be understood by persons having ordinary skill in the art.)

Figure 2:
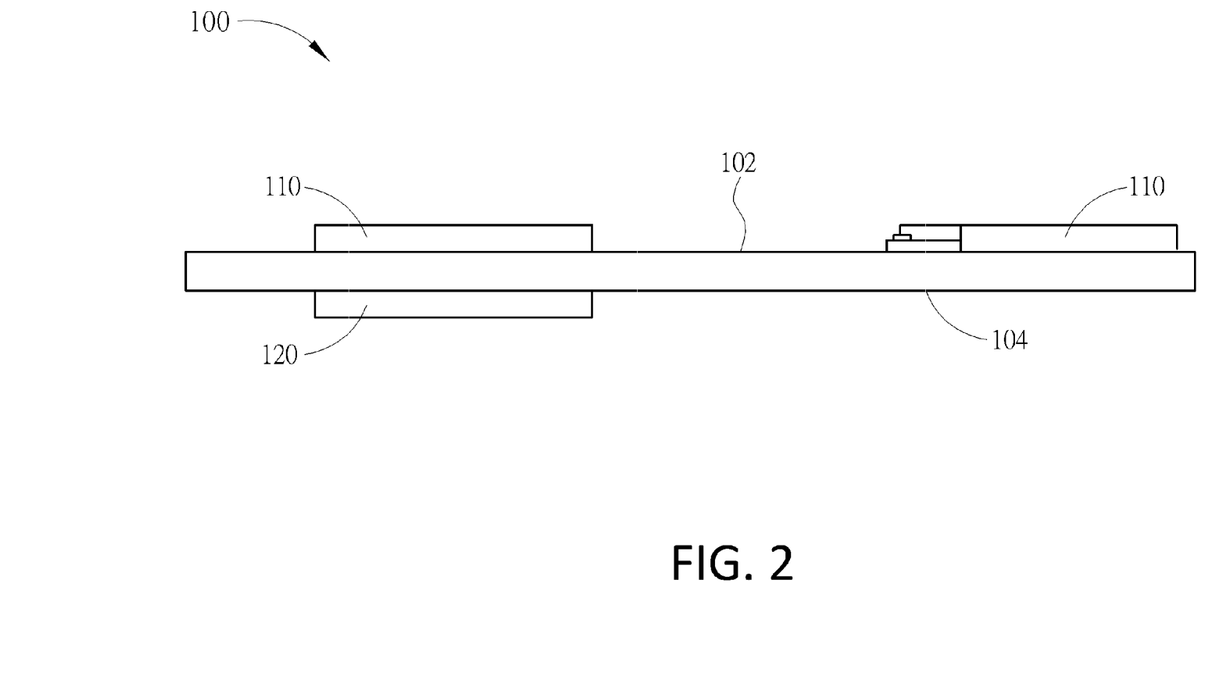
FIG. 2 and FIG. 3 are schematic diagrams showing that a plurality of shielding covers is connected with a circuit board.
Figure 3:
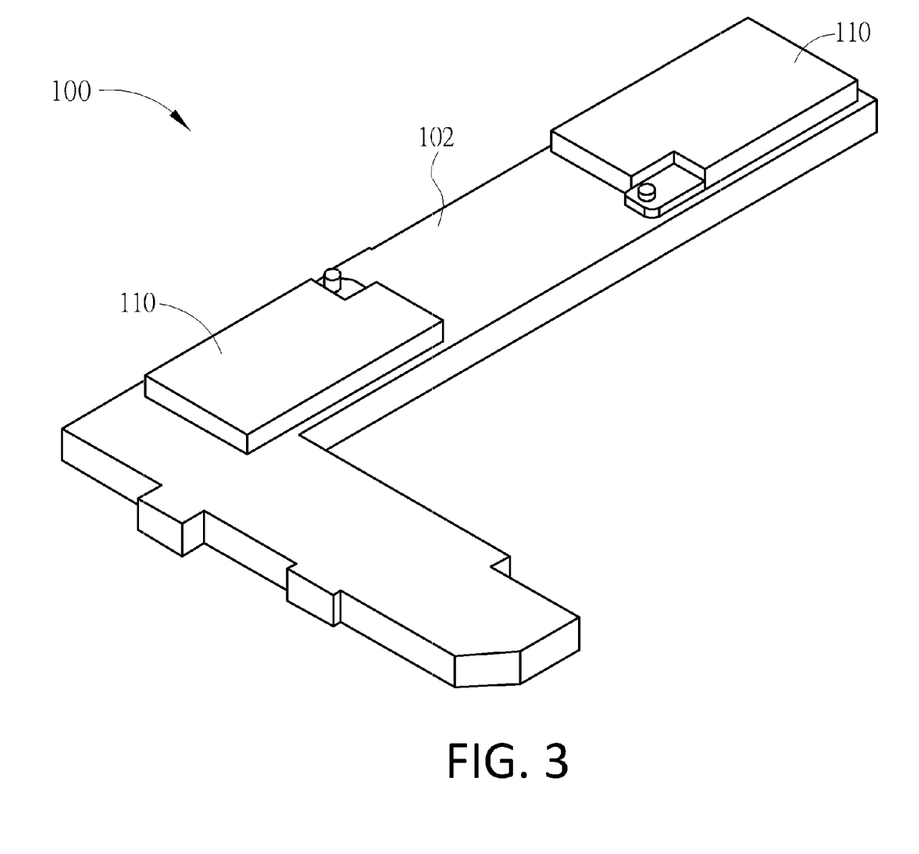

Please refer to FIG. 2 and FIG. 3, which are schematic diagrams showing that a plurality of shielding covers are connected with a circuit board. The circuit board 100 has an upper surface 102 and a lower surface 104. The upper surface 102 is connected with upper shielding covers 110 by solder, and the lower surface 104 is connected with a lower shielding cover 120. In one embodiment, the shielding cover mounting and dismounting apparatus 1 mounts or dismounts the upper shielding covers 110 of the upper surface 102 by direct-contact heating, and mounts or dismounts the lower shielding cover 120 of the lower surface 104 by heat-conducting heating. That is, the lower surface 104 can be connected with the lower shielding cover 120 using low-temperature solder that can be melted by heat-conducting heating. In other embodiments, the upper surface 102 of the circuit board 100 does not have an upper shielding cover 110, and the shielding cover mounting and dismounting apparatus 1 heats the lower shielding cover 120 of the lower surface 104 by direct-contact heating.

Figure 4:
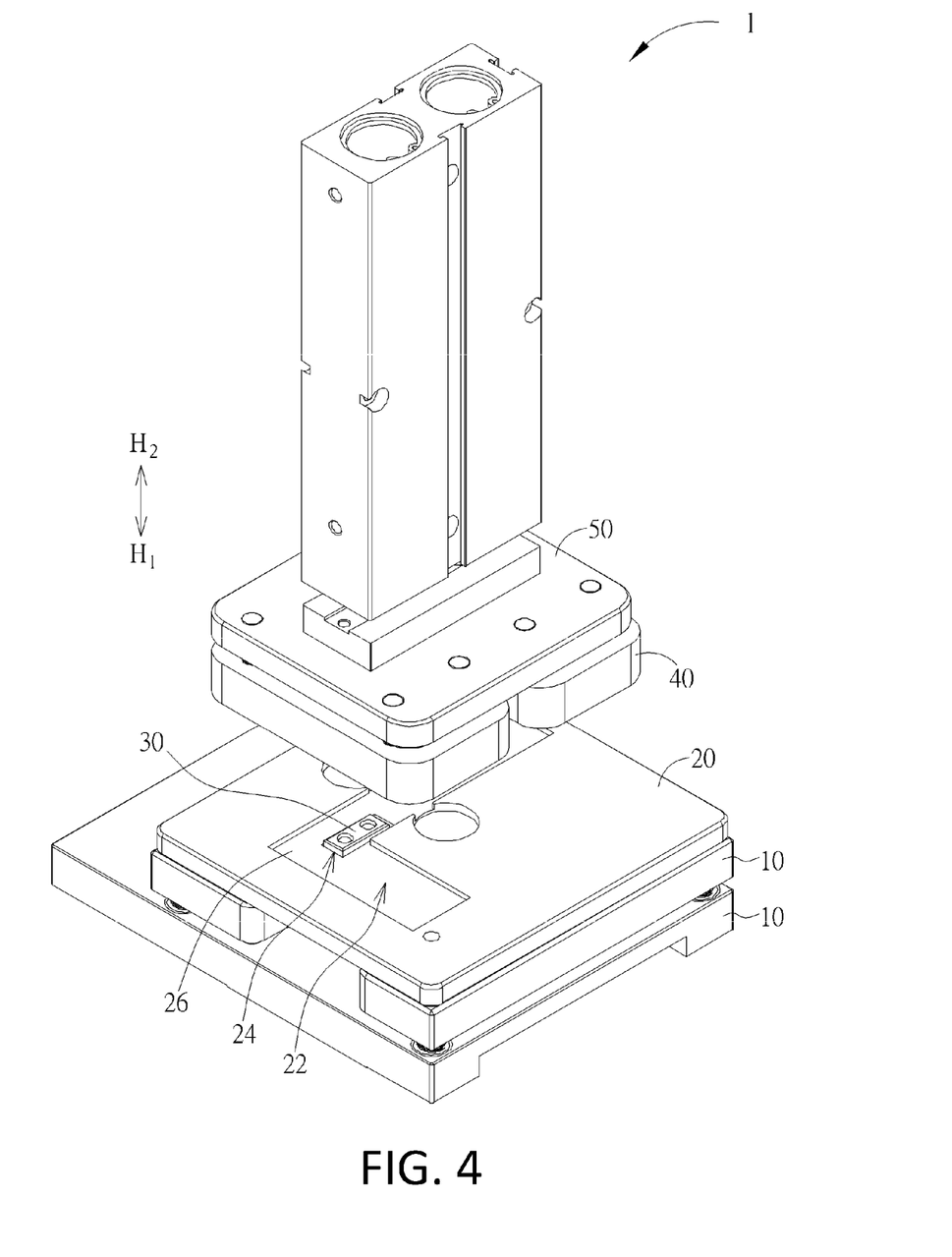
FIG. 4 is a schematic diagram of the major components of the shielding cover mounting and dismounting apparatus according to an embodiment of the present disclosure.
Figure 5:
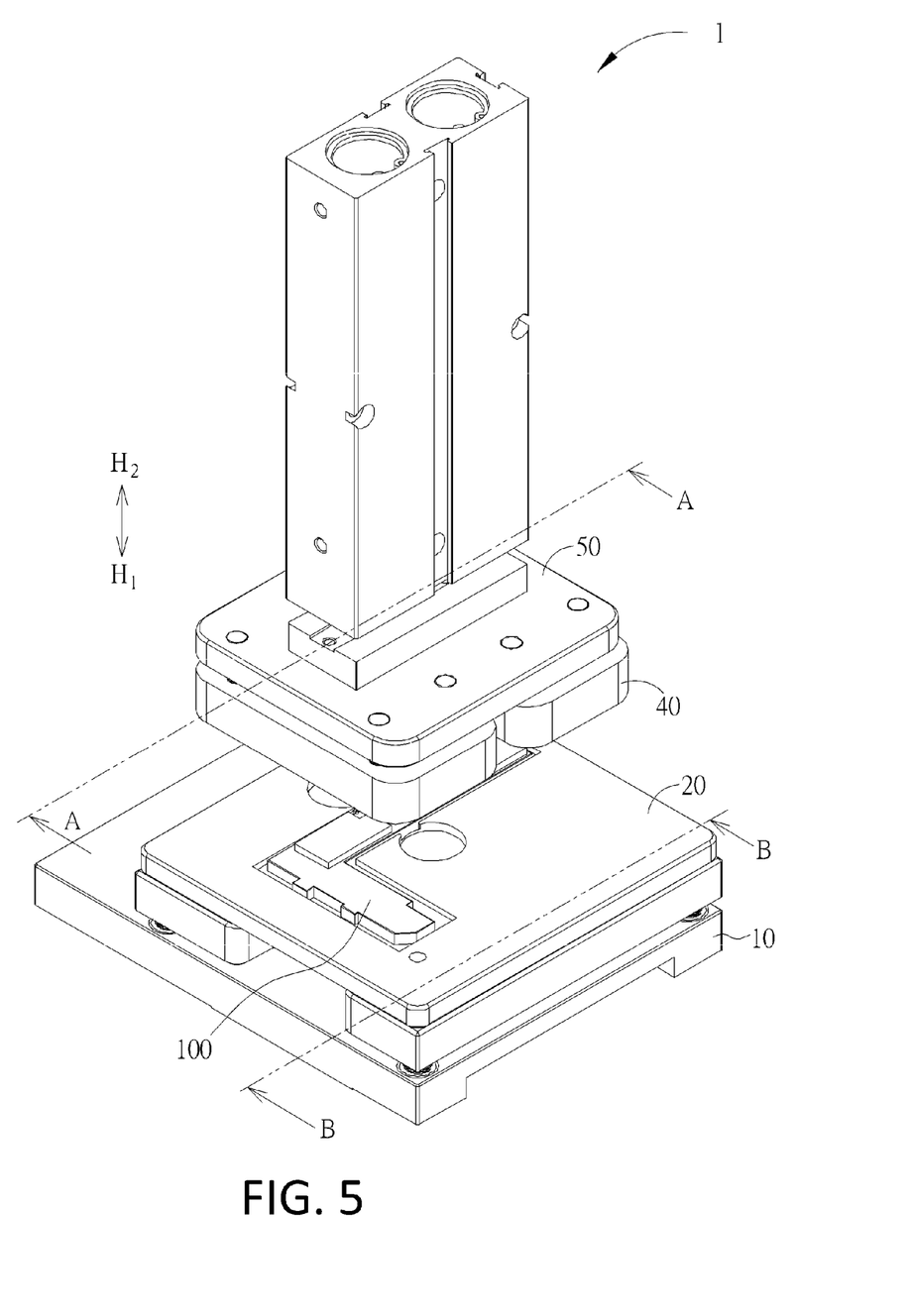
FIG. 5 is a schematic diagram illustrating that a circuit board is disposed at the shielding cover mounting and dismounting apparatus.

Please refer to FIG. 4 and FIG. 5, wherein FIG. 4 is a schematic diagram of the major components of the shielding cover mounting and dismounting apparatus 1 according to an embodiment of the present disclosure, and FIG. 5 is a schematic diagram illustrating that the circuit board 100 is disposed at the shielding cover mounting and dismounting apparatus 1. The shielding cover mounting and dismounting apparatus 1 includes a base 10, a first supporting seat 20, a second supporting seat 30, heaters 40 and a moving seat 50.

Figure 6:
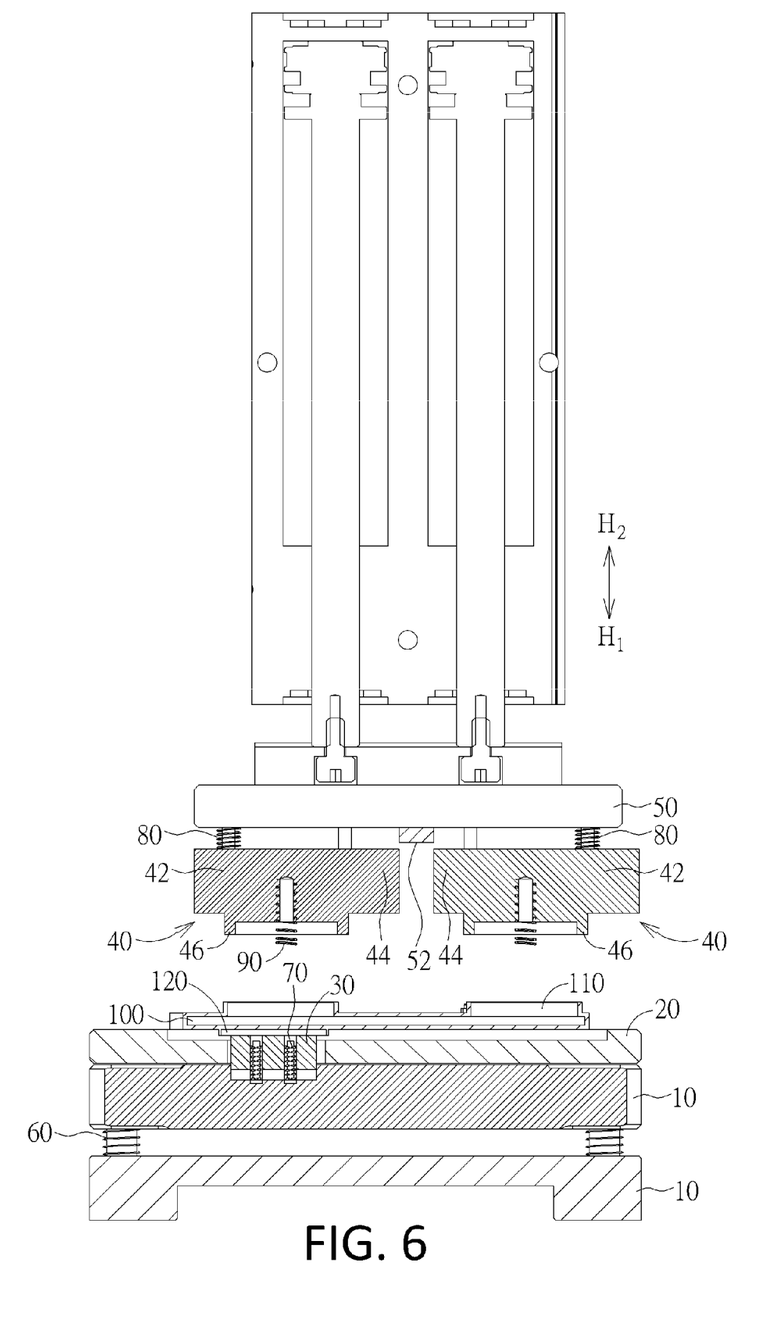
FIG. 6 is a sectional schematic diagram showing the shielding cover mounting and dismounting apparatus taken along the AA line in FIG. 5.
Figure 7:
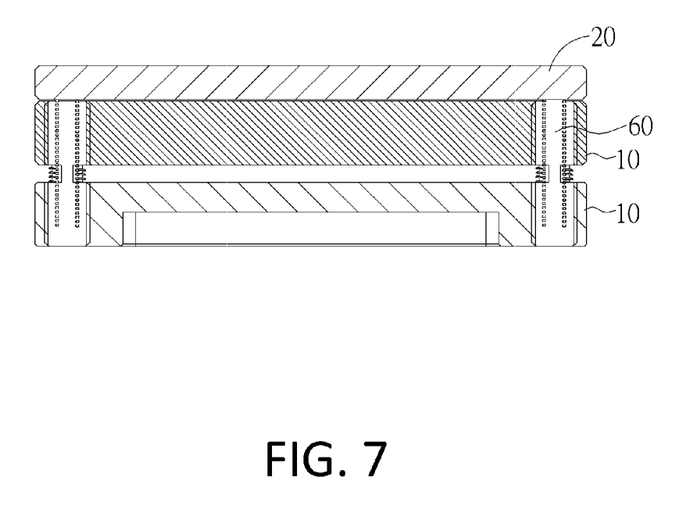
FIG. 7 is another sectional schematic diagram showing the shielding cover mounting and dismounting apparatus taken along the BB line in FIG. 5.

Please refer to FIG. 6 and FIG. 7. FIG. 6 is a sectional schematic diagram showing the shielding cover mounting and dismounting apparatus 1 taken along the AA line, and FIG. 7 is another sectional schematic diagram showing the shielding cover mounting and dismounting apparatus 1 taken along the BB line. Please also refer to FIG. 4, the base 10 includes a plurality of first elastic members 60 (preferably springs). The first supporting seat 20 is disposed at the base 10 and has a bearing cavity 22 for bearing the upper shielding covers 110, the circuit board 100 and the lower shielding cover 120, and the lower shielding cover 120 is disposed between the circuit board 100 and a bottom surface 26 of the bearing cavity 22. The bearing cavity 22 has an opening 24. The second supporting seat 30 includes a second elastic member 70. The second supporting seat 30 is disposed in the opening 24 of the bearing cavity 22, and the second elastic member 70 (preferably a spring) supports the second supporting seat 30 on the base 10, so that the second supporting seat 30 can move relative to the first supporting seat 20 in the opening 24 via the second elastic member 70. The position of the opening 24 corresponds to the position of the lower shielding cover 120 of the circuit board 100. Therefore, when the circuit board 100 and the lower shielding cover 120 of the lower surface 104 are disposed in the bearing cavity 22, the position of the second supporting seat 30 also corresponds to the lower shielding cover 120.

The moving seat 50 includes a plurality of third elastic members 80 (preferably springs) connecting with the moving seat 50 to the heaters 40. The moving seat 50 and the heaters 40 are disposed above the first supporting seat 20, the second supporting seat 30 and the base 10. More specifically, the moving seat 50 and the heaters 40 are disposed at one side of the upper surface 102 of the circuit board 100, and the moving seat 50 can drive the heaters 40 to move upward and downward along the $H_1H_2$ directions to make the heaters 40 move closer to or away from the circuit board 100. The moving seat 50 can drive the heaters 40 by pneumatic, hydraulic or electromagnetic; the present disclosure is not limited therein. When the lower shielding cover 120, the circuit board 100 and the upper shielding covers 110 are disposed in the bearing cavity 22, the moving seat 50 and the heaters 40 face the upper surface 102 of the circuit board 100, and the moving seat 50 can drive the heaters 40 to move along the $H_1$ direction to abut on the upper shielding covers 110 of the circuit board 100 and heat the upper shielding covers 110 and the lower shielding cover 120, so that the upper shielding covers 110 and the lower shielding cover 120 can be dismounted from the circuit board 100.

Please keep referring to FIG. 6 and FIG. 7, each heater 40 includes a fourth elastic members 90 protrudingly disposed at one side of each heater 40 opposite to the connection of the moving seat 50 and the third elastic members 80, and the third elastic members 80 connect the heaters 40 to the moving seat 50 (in the present embodiment, the number of the heater is two, but the present disclosure is not limited therein). As shown in FIG. 6 and FIG. 7, the third elastic members 80 are disposed at first sides of the heaters 40 (the outer sides 42), and second sides of the heaters 40 (the inner sides 44, or the other sides opposite to the third elastic members 80) are hung from the moving seat 50, wherein to dispose the third elastic members 80 at the outer sides 42 of the heaters 40 is one way to implement the present disclosure. In other embodiments, the third elastic members 80 may be disposed at the inner sides 44 of the heaters 40, while the outer sides 42 of the heaters 40 are hung from the moving seat 50. As shown in the drawings, the moving seat 50 further has a stop member 52 outside the inner sides 44 of the heaters 40.

Figure 8:
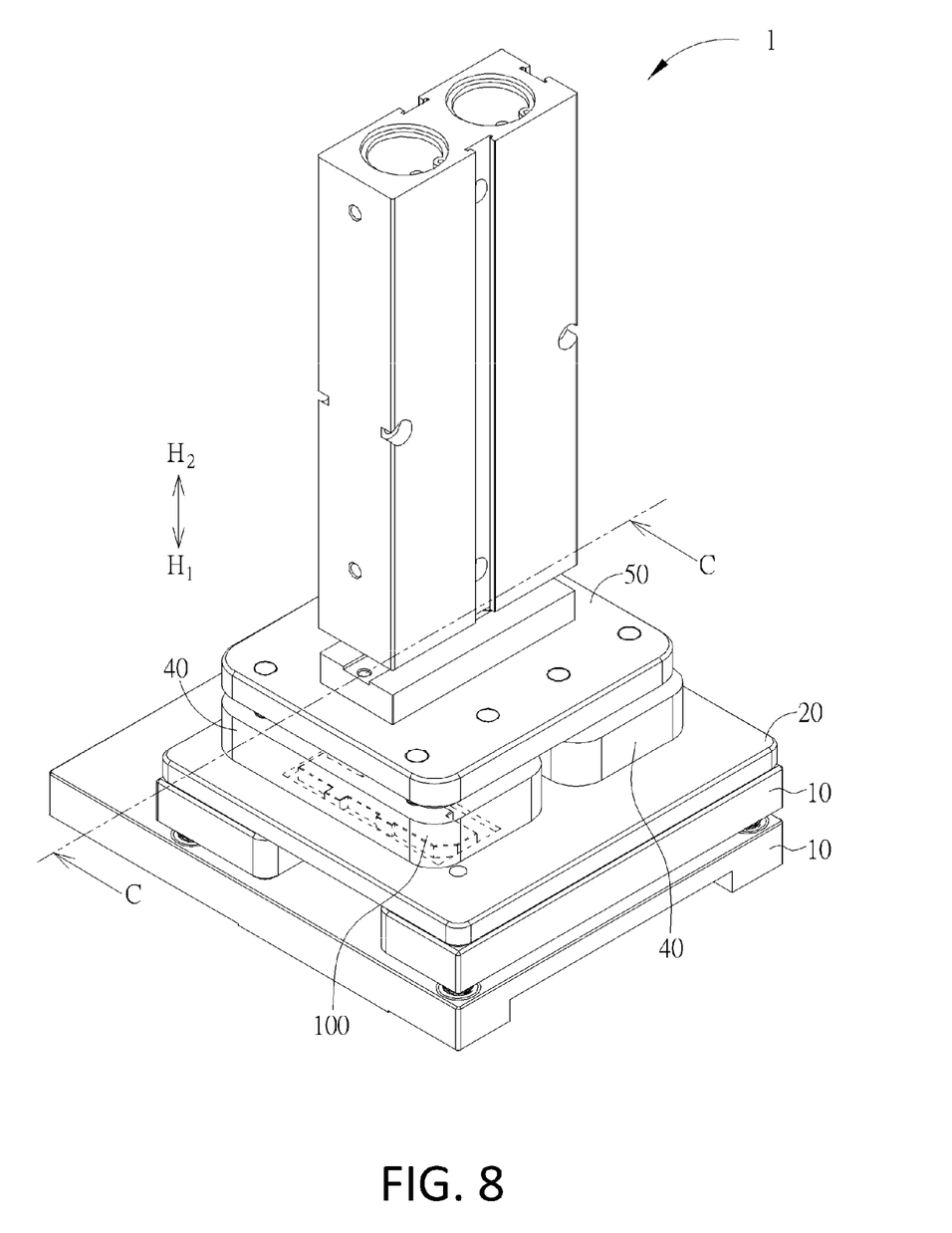
FIG. 8 is a schematic diagram illustrating that the moving seat drives the heaters to move so that the heaters abut on the upper surface of the circuit board.
Figure 9:
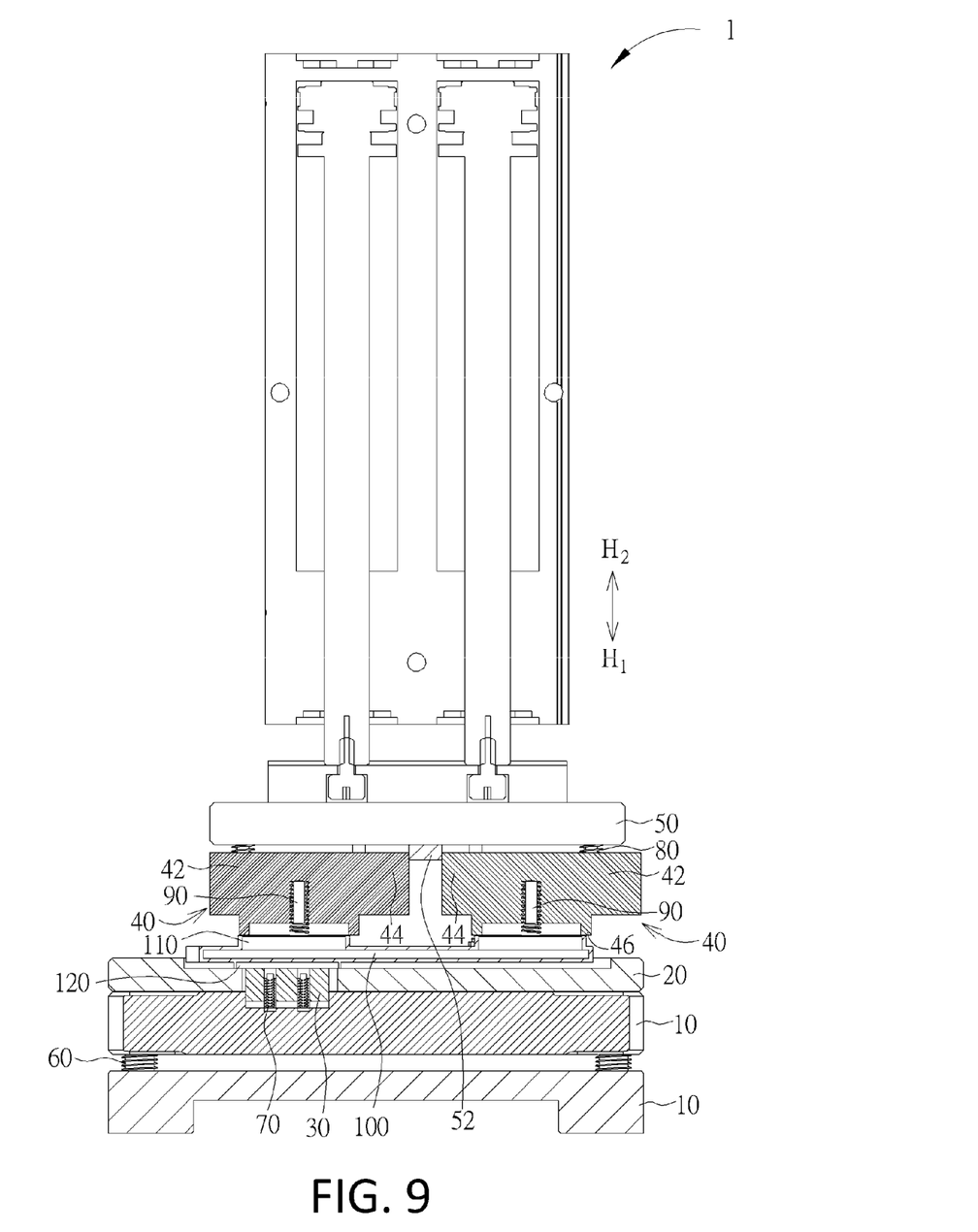
FIG. 9 is a sectional schematic diagram taken along the CC line in FIG. 8.

Please refer to FIG. 8 and FIG. 9, wherein the FIG. 8 is a schematic diagram illustrating that the moving seat 50 drives the heaters 40 to move so that the heaters abut on the upper surface 102 of the circuit board 100, and FIG. 9 is a sectional schematic diagram taken along the CC line in FIG. 8. When the moving seat 50 drives the heaters 40 to move toward the $H_1$ direction (the direction toward the circuit board 100), the moving seat 50 exerts downward pressing force to the heaters 40 to compress the third elastic member 80 and make the inner sides 44 of the heaters 40 abut on the stop member 52 to ensure that the heaters 50 can be positioned on the upper shielding covers 110 precisely. The heaters 40 exert downward pressing force to the upper shielding covers 110 due to the elastic force of the compressed third elastic members 80. Therefore, the fourth elastic members 90 are compressed by the upper shielding covers 110. Since the downward pressing force provided by the heaters 40 pushes the upper shielding covers 110, the circuit board 100, the lower shielding cover 120, the second supporting seat 30 and the first supporting seat 20 to move downward, the first elastic members 60 is compressed, and the second supporting seat 30 exerts downward pressing force to the second elastic member 70 to compress the second elastic member 70.

Please refer to FIG. 9. In the present embodiment, the heaters 40 further have heating portions 46. A first peripheral contour (not shown in the drawings) of the heating portions 46 corresponds to a second peripheral contour (not shown in the drawings) of the upper shielding covers 110 and a third peripheral contour (not shown in the drawings) of the lower shielding cover 120. When the heaters 40 abut on the upper shielding cover 110, the first peripheral contour of the heating portions 46 contacts the second peripheral contour of the upper shielding covers 110 to heat the second peripheral contour of the upper shielding covers 110 and the third peripheral contour of the lower shielding cover 120. When the heaters 40 abut on the upper shielding covers 110 of the circuit board 100 with the heating portions 46, the first peripheral contour of the heating portions 46 only contacts the second peripheral contour of the upper shielding covers 110 to heat the second peripheral contour of the upper shielding covers 110, and heat the third peripheral contour of the lower shielding cover 120 via heat conduction, so that the upper shielding covers 110 and the lower shielding cover 120 can be dismounted from the circuit board 100 due to the melting of the solder in between (the second supporting seat 30 below the lower shielding cover 120 offers vacuum suction force) to complete the dismounting operation. If it is not necessary to dismount the upper shielding covers 110, the heating temperature can reach the temperature to only melt the solder of the lower shielding cover 120 (such as a low temperature solder). Furthermore, in other embodiments, when the circuit board 100 does not have an upper shielding cover 110 and it is only required to dismount the lower shielding cover 120, the heaters 40 can be disposed at the upper surface 102 of the circuit board 100 at a position corresponding to the lower shielding cover 120. The heating portions 46 of the heaters 40 can match the third peripheral contour of the lower shielding cover 120, so that the heating portions only heat third peripheral contour of the lower shielding cover 120 via heat conduction.

When the heaters 40 moves away from the upper shielding covers 110, the fourth elastic members 90 provide restoring force to push the upper shielding covers 110 to separate the heaters 40 from the upper shielding covers 110. When soldering the lower shielding cover 120 back to the lower surface 104 of the circuit board 100, using the shielding cover mounting and dismounting apparatus 1 of the present embodiment, it is not necessary to remove the residual solder on the lower surface 104 of the circuit board 100 and the lower shielding cover 120 can be soldered back directly. That is, the shielding cover mounting and dismounting apparatus 1 of the present embodiment can be used to process the circuit board 100 without de-soldering. The process is explained below.

First, the lower shielding cover 120 is disposed on the second supporting seat 30 at the opening 24 of the bearing cavity 22 of the first supporting seat 20. Then, the circuit board 100 is placed at the bearing cavity 22 above the lower shielding cover 120. At this moment, since the residual solder on the lower surface 104 of the circuit board 100 is not uniformly distributed, the contact surface of the residual solder of the lower surface 104 to the lower shielding cover 120 is not smooth. When the heaters 40 abut on the upper surface 102, the heaters 40 exert downward pressing force to the circuit board 100 to make the upper shielding cover 110, the circuit board 100, the lower shielding cover 120, the second supporting seat 30 and the first supporting seat 20 move downward, causing the first elastic members 60 to be compressed. The lower shielding cover 120 thus abuts on and exert force to the second supporting seat 30 to make the second supporting seat 30 exert downward pressing force to the second elastic member 70 to compress the second elastic member 70. By heating the solder between the lower surface 104 of the circuit board 100 and the lower shielding cover 120 by heat conduction, since the second supporting seat 30 abuts on the lower shielding cover 120 and exerts force toward the circuit board 100 through the lower shielding cover 120 when the solder is melted, the uniform contact and proper distribution of the solder between the third peripheral contour of the lower shielding cover 120 needed to be soldered and the lower surface 104 of the circuit board 100 can be ensured.

Moreover, it is not necessary to remove the residual solder on the upper surface 102 of the circuit board 100 when soldering back the upper shielding cover 100 to the upper surface 102 of the circuit board 100. When the heaters 40 exert downward pressing force to the upper shielding cover 100 due to the elastic force of the compressed third elastic member 80 so that the fourth elastic members 90 is compressed and the heaters 40 abut on the upper shielding cover 110 of the upper surface 102 of the circuit board 100, the fourth elastic member exerts force to press the upper shielding cover 100 downward. Therefore, when heating to melt the non-uniform solder paste on the upper surface 102 of the circuit board 100, the compressed fourth elastic members 90 exerts downward pressing force to push the upper shielding cover 110 to ensure the uniform contact and proper distribution of the solder between the second peripheral contour of the upper shielding cover 110 needed to be soldered and the upper surface 102 of the circuit board 100. When the heaters 40 stop heating and move away from the circuit board 100, the fourth elastic members 90 provide restoration force to push the upper shielding cover 100 to separate the heaters 40 from the upper shielding cover 110.

The shielding cover mounting and dismounting apparatus of the present disclosure uses the second elastic member and the third elastic member to provide cushioning and abutting functionalities. When using the heaters above to press and heat the upper shielding cover or the circuit board, the second supporting seat pushes the lower shielding cover to make the lower shielding cover be pressed and abut on the lower surface of the circuit board. The shielding cover mounting and dismounting apparatus dismounts the lower shielding cover of the circuit board by using the heaters to heat and melt the solder (such as a low-temperature solder), and solders the lower shielding cover back to the circuit board without removing the residual solder also by using the heaters to heat and melt the solder (such as a low-temperature solder). In this way, the speed of mounting and dismounting the shielding cover during the rework process can be accelerated, and the quality and stability of the rework process can be guaranteed.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. A shielding cover mounting and dismounting apparatus for mounting or dismounting a lower shielding cover connected with a circuit board, the circuit board having an upper surface and a lower surface, the lower shielding cover being connected with the lower surface, the shielding cover mounting and dismounting apparatus comprising:
    a base;
    a first supporting seat disposed on the base, the first supporting seat has a bearing cavity, the lower shielding cover and the circuit board are disposed in the bearing cavity, and the lower shielding cover is disposed between the circuit board and a bottom surface of the bearing cavity;
    a second supporting seat including a second elastic member, the second supporting seat is disposed in an opening of the bearing cavity, the second elastic member supports the second supporting seat on the base, whereby the second supporting seat can move relative to the first supporting seat in the opening of the bearing cavity via the second elastic member, wherein a position of the second supporting seat corresponds to the lower shielding cover to support the circuit board in the bearing cavity;
    a heater disposed at one side of the upper surface of the circuit board disposed in the bearing cavity, the heater is movably abutted on the upper surface of the circuit board to heat the lower shielding cover connected on the lower surface of the circuit board whereby the lower shielding cover is capable of being dismounted from the circuit board; and
    a moving seat including a plurality of third elastic members, the third elastic members connect the moving seat to the heater, the moving seat drives the heater to move closer to or away from the circuit board.

2. The shielding cover mounting and dismounting apparatus according to claim 1, wherein the third elastic members are disposed at a first side of the heater, the moving seat further has a stop member, the stop member is disposed outside a second side of the heater, when the heater abuts on the upper surface of the circuit board, the third elastic members pushes the heater, and the second side of the heater abuts on the stop member.

3. The shielding cover mounting and dismounting apparatus according to claim 2, wherein the second side of the heater is hung from the moving seat.

4. The shielding cover mounting and dismounting apparatus according to claim 1, wherein the base further comprises a plurality of first elastic members, when the moving seat drives the heater to move closer to the circuit board to abut on the upper surface of the circuit board, the first supporting seat exerts force on the base whereby the first elastic members are compressed.

5. The shielding cover mounting and dismounting apparatus according to claim 4, wherein when the moving seat drives the heater to move closer to the circuit board to abut on the upper surface of the circuit board, the lower shielding cover exerts force to the second supporting seat, the second supporting seat exerts force to the second elastic member whereby the second elastic member is compressed.

6. The shielding cover mounting and dismounting apparatus according to claim 1, wherein the circuit board further comprises an upper shielding cover, the upper shielding cover is connected with the upper surface of the circuit board, and the heater abuts on the upper shielding cover to heat the upper shielding cover and the lower shielding cover.

7. The shielding cover mounting and dismounting apparatus according to claim 6, wherein the heater further comprises a fourth elastic member, the fourth elastic member is protrudingly disposed at one side of the heater opposite to the connection of the moving seat, when the heater abuts on the upper shielding cover of the circuit board, the upper shielding cover compresses the fourth elastic member, when the heater moves away from the upper shielding cover, the fourth elastic member pushes the upper shielding cover to separate the heater from the upper shielding cover.

8. The shielding cover mounting and dismounting apparatus according to claim 6, wherein the heater further has a heating portion, a first peripheral contour of the heating portion corresponds to a second peripheral contour of the upper shielding cover, when the heater abuts on the upper shielding cover, the first peripheral contour of the heating portion touches the second peripheral contour of the upper shielding cover to heat the second peripheral contour of the upper shielding cover.

9. The shielding cover mounting and dismounting apparatus according to claim 1, wherein the heater further has a heating portion, the heating portion is disposed at one side of the upper surface corresponding to a position of the lower shielding cover, a first peripheral contour of the heating portion corresponds to a third peripheral contour of the lower shielding cover, when the heater abuts on the upper surface, the heating portion heats the third peripheral contour of the lower shielding cover.

10. The shielding cover mounting and dismounting apparatus according to claim 1, wherein the lower shielding cover is connected with the lower surface by solder.

* * * * *